United States Patent [19]

Camisa

[11] 4,374,394
[45] Feb. 15, 1983

[54] MONOLITHIC INTEGRATED CIRCUIT

[75] Inventor: Raymond L. Camisa, East Windsor, N.J.

[73] Assignee: RCA Corporation, New York, N.Y.

[21] Appl. No.: 192,849

[22] Filed: Oct. 1, 1980

[51] Int. Cl.³ ..................... H01L 23/34; H01L 23/50
[52] U.S. Cl. ........................................ 357/81; 357/56; 357/80
[58] Field of Search ..................... 357/81, 56, 41, 65, 357/68, 80

[56] References Cited

U.S. PATENT DOCUMENTS

| | | | |
|---|---|---|---|
| 3,150,299 | 9/1964 | Noyce | 317/235 |
| 3,173,101 | 3/1965 | Stelmak | 330/37 |
| 3,209,214 | 9/1965 | Murphy | 317/234 |
| 3,343,256 | 9/1967 | Smith et al. | 29/578 |
| 3,402,331 | 9/1968 | Rittner | 317/235 |
| 3,986,196 | 10/1976 | Decker et al. | 357/22 |

OTHER PUBLICATIONS

Pucel et al., "An X-Band GaAs FET Monolithic Power Amplifier", *1979 International Microwave Symposium Digest*, Apr. 30–May 2, 1979, pp. 387–389.

*Primary Examiner*—James W. Davie
*Attorney, Agent, or Firm*—Birgit E. Morris; Donald S. Cohen; Kenneth R. Glick

[57] ABSTRACT

A monolithic integrated circuit comprises a substrate having first and second opposing major surfaces. A semiconductor device is at the first major surface, a circuit film pattern is on the second major surface, and means for interconnecting the device to the film pattern are provided. On the first surface, a metallization layer surrounds the device and has a thickness greater than the height of the device from the first surface. Additionally, an electrode extension projects from the device to a height substantially equal to the thickness of the metallization layer.

9 Claims, 3 Drawing Figures

MONOLITHIC INTEGRATED CIRCUIT

BACKGROUND OF THE INVENTION

The present invention relates to monolithic integrated circuits. More particularly, it relates to monolithic integrated circuits for use in microwave applications.

The term monolithic integrated circuit generally refers to an integrated circuit in which substantially all active, passive and interconnection elements are disposed on a single substrate. When the circuit incorporates a power semiconductor device such as an amplifier, the circuit is typically bonded to a heat sink and includes some form of electrical passivation such as hermetic sealing within a device package.

Monolithic integrated circuits for use at microwave frequencies are typically ormed in compound semiconductors such as semi-insulating GaAs and typically incorporate a microstrip circuit pattern on a major substrate surface. As with integrated circuits generally, the design of monolithic microwave integrated circuits for power applications requires certain tradeoffs. For example, while a relatively thin substrate might be desirable from the standpoint of heat dissipation, a thin substrate will increase the extent of circuit losses (Q) of a microstrip circuit disposed on the substrate. A conventional device/heat sink configuration, utilizing a contact plated through the substrate, is disclosed in U.S. Pat. No. 3,986,196, THROUGH-SUBSTRATE SOURCE CONTACT FOR MICROWAVE FET, issued Oct. 12, 1976 to D. R. Decker et al. A conventional monolithic microwave integrated circuit, incorporating an FET and a microstrip circuit on the same substrate, is disclosed in the article AN X-BAND GaAs FET MONOLITHIC POWER AMPLIFIER, by R. A. Pucel et al, published in the 1979 International Microwave Symposium Digest, Apr. 30–May 2, 1979.

SUMMARY OF THE INVENTION

A monolithic integrated circuit includes a substrate having a semiconductor device at a first major surface, a circuit film pattern on a second major surface, and means for interconnecting the semiconductor device to the circuit film pattern. A metallization layer is also disposed on the first surface. The metallization layer surrounds the device and has a thickness greater than the height of the device from the first surface. Additionally, the device incorporates an electrode which projects to a height substantially equal to the thickness of the metallization layer.

DETAILED DESCRIPTION

Figure 1:
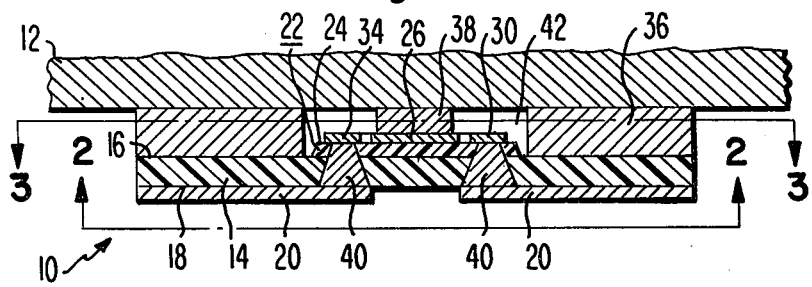
FIG. 1 is a sectional view of a preferred embodiment of a monolithic integrated circuit of the present invention bonded to a heat sink.

A sectional view of a monolithic integrated circuit 10 bonded to a heat sink 12 is illustrated in FIG. 1. The circuit 10 includes a substrate 14 having first and second opposing major surfaces, 16 and 18 respectively. The substrate 14 can be a single element semiconductor such as silicon, a semi-insulating compound semiconductor such as a binary, ternary or quaternary compound, or an insulator such as sapphire.

Figure 2:
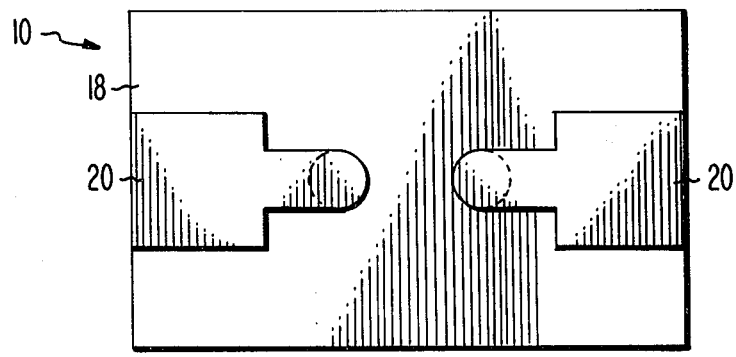
FIG. 2 is a view of the circuit taken along plane 2—2 of FIG. 1.

A pattern of circuit film 20 is disposed on the second substrate surface 18 and is further illustrated in FIG. 2. When the integrated circuit 10 is to be used in a microwave application, the substrate 14 is preferably a semi-insulating material and the circuit film 12 is a patterned metal film. The patterned metal circuit film 12 is preferably a distributed transmission line such as a coplanar waveguide, slot guide, or microstrip line, and can include lumped elements such as inductors, resistors and capacitors.

A semiconductor device 22 is disposed at the first substrate surface 16. The device 22 can be externally disposed on the surface 16 or it can be an internal structure within the substrate 14. In the embodiment illustrated in FIG. 1, the device 22 is a field effect transistor (FET) incorporated in a mesa-type structure which projects from the surface 16. For example, when the substrate 14 is semi-insulating GaAs, the mesa 24 can be an N doped layer formed by epitaxial growth or ion implantation.

Figure 3:
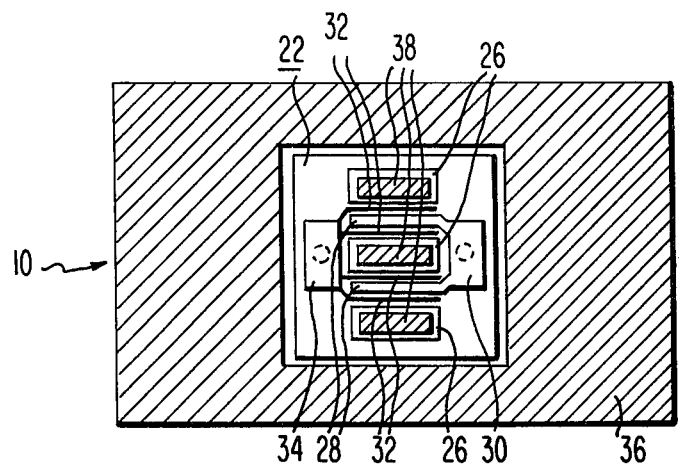
FIG. 3 is a sectional view of the circuit taken through plane 3—3 of FIG. 1.

As shown in FIG. 3, the device incorporates three generally rectangular source electrodes 26. The three source electrodes 26 are arranged in series, and are interdigitated with and spaced from two drain electrodes 28. Between each drain electrode and the neighboring source electrode on either side of it is a gate electrode 32. The two drain electrodes 28 are electrically interconnected at a drain electrode pad 30, and all gate electrodes are interconnected at a gate electrode pad 34, of similar configuration to the drain electrode pad 30. It is important to recognize that although the illustrated embodiment shows an interdigitated, multiple source/gate/drain structure, a single source/gate/drain structure is possible as well. The illustrated embodiment merely represents an exemplary configuration for a device incorporating a plurality of source, gate and drain electrodes.

As illustrated in FIGS. 1 and 3, a metallization layer 36 extends from the first substrate surface 16 and surrounds the device 22. The metallization layer 36 has a thickness which is greater than the height to which the device 22 extends from the first surface 16. Additionally, an electrode extension 38 projects from each source electrode 26 to a height substantially equal to the thickness of the metallization layer 36. Again, it should be emphasized that the illustrated embodiment is merely exemplary. The invention does not require a plurality of electrode extensions 38 nor does it require that the extensions each project from the source electrode of an FET. For example, if the device 22 was an FET incorporating a single set of source, gate and drain electrodes, then a single electrode extension would be used. If the device 22 was a diode incorporating anode and cathode electrodes, then a single electrode extension might project from either the anode or cathode electrodes.

Means for interconnecting the device 22 with the circuit film 20 are shown at 40 in FIG. 1. In the preferred embodiment, these interconnection means 40 are electrically conducting passageways, such as metallized via holes, through the substrate 14 and mesa 24. In the exemplary FET device 22, the interconnect means 40 electrically connect the gate and drain electrode pads 34 and 30 to the circuit film 20 pattern on the second substrate surface 18.

The monolithic integrated circuit 10 thus described can be fabricated utilizing conventional semiconductor processing techniques. Standard photolithographic pattern generation, doping, etching and metal deposition processes can be used to form the device 22, the via holes for the interconnection means 40, the circuit film 20 and the metallization layer 36. Furthermore, the metallization layer 36 and electrode extension 38 can be conventionally thermocompression bonded or ultrasonically bonded directly to a metal heat sink 12.

The monolithic integrated circuit 10 provides several advantages over a conventional integrated circuit structure. In the present invention, the configuration of the metallization layer 36 surrounding the device 22 creates a cavity 42. When the metallization layer 36 is bonded to the heat sink 12, this cavity is effectively sealed, so as to isolate the device 22. When the circuit 10 is bonded to the heat sink 12, the device 22 can be further electrically passivated by either evacuating the cavity 42 or by providing some passivation coating on the exposed surfaces of the device 22. Since conventional power devices typically incorporate both a heat sink and a hermetically sealed package, the structure of the monolithic circuit of the present invention can simplify the packaging of such devices.

The configuration of circuit 10, with active and passive circuit elements (device 22 and circuit film 20 respectively) on opposite sides of a substrate, increases both the active device density and the isolation between active and passive elements. The presence of the circuit film 20 on an opposite substrate surface from the device 22 creates greater flexibility in designing the size and configuration of the device 22. This can be particularly beneficial when, for example, the substrate 14 includes a plurality of devices 22 on the first surface 16.

As previously indicated, when the circuit 10 is used in a microwave application, the substrate 14 is preferably an insulator or semi-insulator, and the circuit film 20 is in the configuration of a distributed transmission line (such as microstrip) pattern. Furthermore, in addition to providing a method for extracting heat from the device, the heat sink 12 provides an electrical ground. Thus, in the described embodiment, both the source electrode 26 of the FET 22 and the metallization layer 36 across the first substrate surface 16 are grounded.

In microwave circuits generally, the distance between the distributed transmission line pattern and the ground plane is a factor which influences the degree of dissipative energy loss within the circuit. The loss decreases as the distance between the transmission line and the ground plane increases. Since the transmission line and ground plane are typically on opposite sides of a substrate, it is desirable to use a relatively thick substrate in order to reduce this dissipative energy loss. However, in conventional circuits a relatively thin substrate is often desirable to facilitate heat dissipation from the device, therefore necessitating a tradeoff. In the circuit configuration of the present invention, this compromise is avoided because the ability to heat sink the device 22 is not primarily influenced by the thickness of the substrate 14. The electrode extensions 38 provide an effective path for heat flow from the device 22. There are thus fewer constraints in designing the thickness of the substrate 14, making it easier, for example, to reduce energy losses in the transmission line pattern 20.

Furthermore, it should be recognized that although the present invention has been described primarily in terms of a monolithic integrated circuit for use in a microwave application, the invention is applicable to integrated circuits generally. For example, the circuit 10 might include a sapphire substrate having a plurality of semiconductor devices 22 disposed on its surface.

What is claimed is:

1. A monolithic integrated circuit, comprising:
   a substrate having first and second opposing major surfaces;
   a semiconductor device on the first major surface, a circuit film pattern on the second surface, and means for interconnecting the device to the film pattern;
   a metallization layer on the first surface, said layer surrounding the device and having a thickness greater than the height of the device from the first surface; and
   an electrode extension projecting from the device to a height substantially equal to the thickness of the metallization layer.

2. A circuit in accordance with claim 1, further comprising:
   a heat sink, to which the metallization layer and electrode extension are bonded.

3. A circuit in accordance with claim 1, wherein:
   the substrate is a compound semiconductor material.

4. A circuit in accordance with claim 1, wherein:
   the circuit film pattern includes a distributed transmission line.

5. A circuit in accordance with claim 1, wherein:
   the semiconductor device is disposed in a mesa on the first major surface.

6. A circuit in accordance with claim 1, wherein:
   the means for interconnecting the device to the film pattern comprises an electrically conducting passageway through the substrate.

7. A circuit in accordance with claim 6, wherein:
   the conducting passageway is a metallized via hole.

8. A circuit in accordance with claims 1 or 7, wherein:
   the semiconductor device comprises a field effect transistor having source, gate and drain electrodes.

9. A circuit in accordance with claim 8, wherein:
   the gate and drain electrodes are interconnected with the circuit film pattern on the second surface; and
   the electrode extension projects from the source electrode.

* * * * *